United States Patent
Frey et al.

(10) Patent No.: US 7,020,231 B1
(45) Date of Patent: Mar. 28, 2006

(54) TECHNIQUE FOR CREATING EXTENDED BIT TIMER ON A TIME PROCESSING UNIT

(75) Inventors: Michael J. Frey, Noblesville, IN (US); Warren E Donley, Kokomo, IN (US); William F. Ditty, Russiaville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/970,434

(22) Filed: Oct. 21, 2004

(51) Int. Cl.
*G06M 11/00* (2006.01)

(52) U.S. Cl. .......................... 377/20; 700/306; 702/57; 702/79; 702/176; 702/177; 702/178

(58) Field of Classification Search ................ 700/306; 702/57, 79, 176, 177, 178; 377/20
See application file for complete search history.

(56) References Cited

U.S. PATENT DOCUMENTS 5,634,138 A * 5/1997 Ananthan et al. ............. 710/21

* cited by examiner

*Primary Examiner*—Margaret R. Wambach
(74) *Attorney, Agent, or Firm*—Stefan V. Chmielewski

(57) ABSTRACT

A technique for implementing an extended bit timer with a time processing unit (TPU), without using the channel hardware of the TPU includes a number of steps. A timer of the TPU is periodically read to determine the value of the timer. A counter is incremented when rollover of the timer has occurred and a coherency flag is de-asserted after the timer transitions through a first count. The coherency flag is asserted after the value of the timer transitions through a third count and the value of the timer is combined with the value of the counter to provide a current count. When the coherency flag is asserted and the value of the timer is equal to or between the first and second counts, the current count is adjusted.

19 Claims, 4 Drawing Sheets

TECHNIQUE FOR CREATING EXTENDED BIT TIMER ON A TIME PROCESSING UNIT

TECHNICAL FIELD

The present invention is generally directed to a time processor unit (TPU) and, more specifically, to a technique for creating an extended bit timer on a TPU without using channel hardware of the TPU.

BACKGROUND OF THE INVENTION

In general, a time processor unit (TPU) is an intelligent semi-autonomous microcontroller that is designed for timing control. The TPU operates simultaneously with an integrated central processing unit (CPU) and schedules tasks, processes microcode read only memory (ROM) instructions, accesses data shared with the CPU and performs input and output (I/O) functions. For example, TPUs have been included with various microprocessors within the Motorola 68xxx family. With reference to FIG. 1, an exemplary TPU 100 is shown coupled to a CPU 50, which is coupled to a memory subsystem 52. The TPU 100 can be viewed as a special purpose microcontroller that performs a programmable series of two operations, i.e., match and capture. The occurrence of a match or capture is known as an event and a programmed series of events is called a function. In general, TPU functions replace software functions that would have required the CPU 50 to service an interrupt.

With reference to the TPUs incorporated within a Motorola MC68336/376, an A mask set and a G mask set provide various functions. The A mask set provides for the following functions: discrete I/O; input capture/input transition counter; output compare; pulse width modulation; synchronized pulse width modulation; period measurement with additional transition detect; period measurement with missing transition detect; position-synchronized pulse generator; stepper motor; period/pulse width accumulator; and quadrature decode. The G mask set allows for the following functions: table stepper motor; new input capture/transition counter; queued output match; programmable time accumulator; multichannel pulse width modulation; fast quadrature decode; universal asynchronous receiver/transmitter; brushless motor communication; frequency measurement; and Hall effect decode.

When the TPU 100 is a Motorola MC68336/376, the TPU 100 includes two 16-bit reference time bases 110A and 110B, sixteen independent timer channels 112, a task scheduler 106, a microengine 108 and a host interface 104. A dual-ported parameter random access memory (RAM) 104A is included within the host interface 104 and is used to pass parameters between the TPU 100 and the CPU 50. Two 16-bit counters (TCR1) 110A and (TCR2) 110B provide reference time bases for output compare and input capture events.

Prescalers for the time bases are controlled by the CPU 50, via bit fields in the TPU module configuration register. Timer count registers TCR1 and TCR2 provide access to the current counter values. The timer count registers TCR1 and TCR2 can be read by TPU microcode, but are not directly available to the CPU. The TCR1 clock is derived from the system clock and the TCR2 clock can be derived from the system clock or from an external clock input, via a T2CLK pin.

As mentioned, the TPU has sixteen independent channels 112, each of which are connected to a pin of the CPU 50. In general, the channels 112 have identical hardware and each channel 112 includes an event register and pin control logic. The event register contains a 16-bit capture register, a 16-bit compare/match register and a 16-bit greater-than-or-equal-to comparator. The direction of each pin, either input or output, is determined by the microengine 108. Each channel can either use the same time base for match and capture or use one time base for match and the other for capture.

When a service request is received, the scheduler 106 determines which of the channels 112 is serviced by the microengine 108. The channels 112 can request service for one of four reasons: for host service;

for a link to another channel; for a match event; or for a capture event. The host system assigns each active channel one of three priorities; high, middle or low. When multiple service requests are received simultaneously, a priority scheduling mechanism grants service based on channel number and assigned priority.

The microengine 108 includes a control store unit 108A and an execution unit 108B. A control store ROM (not separately shown) holds microcode for each factory-masked time function. When assigned to a channel by the scheduler 106, the execution unit 108B executes microcode for a function assigned to that channel by the CPU 50. The microcode can also be executed from a TPU RAM module instead of the control store 108A. The TPU RAM module allows emulation and development of custom TPU microcode without the generation of a microcode ROM mask. The host interface 104 includes registers that allow for communication between the CPU 50 and the TPU 100 before and during execution of a time function. The registers are accessible from the intermodule bus (IMB) 102 through a bus interface unit. A parameter RAM 104A is located within the host interface 104 and typically occupies 256 bytes at the top of the system address map.

Channel parameters are organized as 128 16-bit words, which can all be accessed by all of the channels. The CPU 50 specifies function parameters by writing to an appropriate RAM 104A address. The TPU reads the RAM 104A to determine the channel operation and can also store information to be read by the CPU 50 in the parameter RAM 104A. The TPU functions are related to one of two 16-bit time bases and functions are synthesized by combining sequences of match events and capture events. The TPU 100 can determine precisely when a match or a capture event occurs and respond rapidly as the primitives are implemented in hardware. An event register for each of the channels 112 provides for simultaneity of match/capture event occurrences on all of the channels 112.

When a match or input capture event requiring service occurs, the affected one of the channels 112 generates a service request to the scheduler 106. The scheduler 106 determines the priority of the request and assigns one of the channels 112 to the microengine 108 at a first available time. The microengine 108 performs the function defined by the content of the control store 108A or emulation RAM using parameters from the parameter RAM 104A located within the host interface 104. Match and capture events are handled by independent channel hardware, which provides for event accuracy of one time base clock period, irrespective of the number of the channels 112 that are active. Inner-channel communication within the TPU 100 can be accomplished by issuing a link service request to another channel, by controlling another channel directly or by accessing assigned memory in the parameter RAM 104A of another channel.

As is briefly mentioned above, the TPU 100 includes limited sized bit timers, e.g., 16-bits, which may, depending upon the application, not include enough bits for performing a desired time function. For example, at 1 microsecond, a 16-bit timer would overflow at 65.5 milliseconds. In practice, to create an extended range timer has required the TPU 100 to wake-up when the 16-bit timer rolls over from FFFFh to 0000h to increment an extra byte or bytes. In order to perform this wake-up, one of the TPU channels 112 has been utilized to schedule the event. Unfortunately, using one of the channels in order to create an extended bit timer has reduced the number of the channels 112 that are available for other functions and, in certain situations, can result in a TPU being unable to perform another function, due to the limited number of TPU channels. In this particular situation, a designer may be required to implement additional TPUs, due to the utilization of channels to implement an extended range timer.

What is needed is a technique that allows a TPU to perform extended range timer functions without utilizing one of the channels of the TPU to perform the function.

SUMMARY OF THE INVENTION

The present invention is directed to a technique for implementing an extended bit timer with a time processing unit (TPU), without using the channel hardware of the TPU. According to the present invention, a timer is periodically read to determine the value of the timer. Next, the technique determines if the value of the timer is equal to or between a first count and a second count. The technique also determines if the value of the timer is equal to or greater than a third count. The technique increments a counter when rollover of the timer has occurred and de-asserts a coherency flag after the timer transitions through the first count. The technique asserts the coherency flag after the value of the timer transitions through the third count and combines the value of the timer with the value of the counter to provide a current count. The technique checks the coherency flag and the value of the timer and adjusts the current count when the coherency flag is asserted and the value of the timer is equal to or between the first and second counts, e.g., 0000h and 7FFFh (inclusive).

According to one embodiment of the present invention, the timer is a 16-bit counter. According to another embodiment of the present invention, the counter is an 8-bit counter. According to a different aspect of the present invention, the timer is read at four times a rollover rate of the timer.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
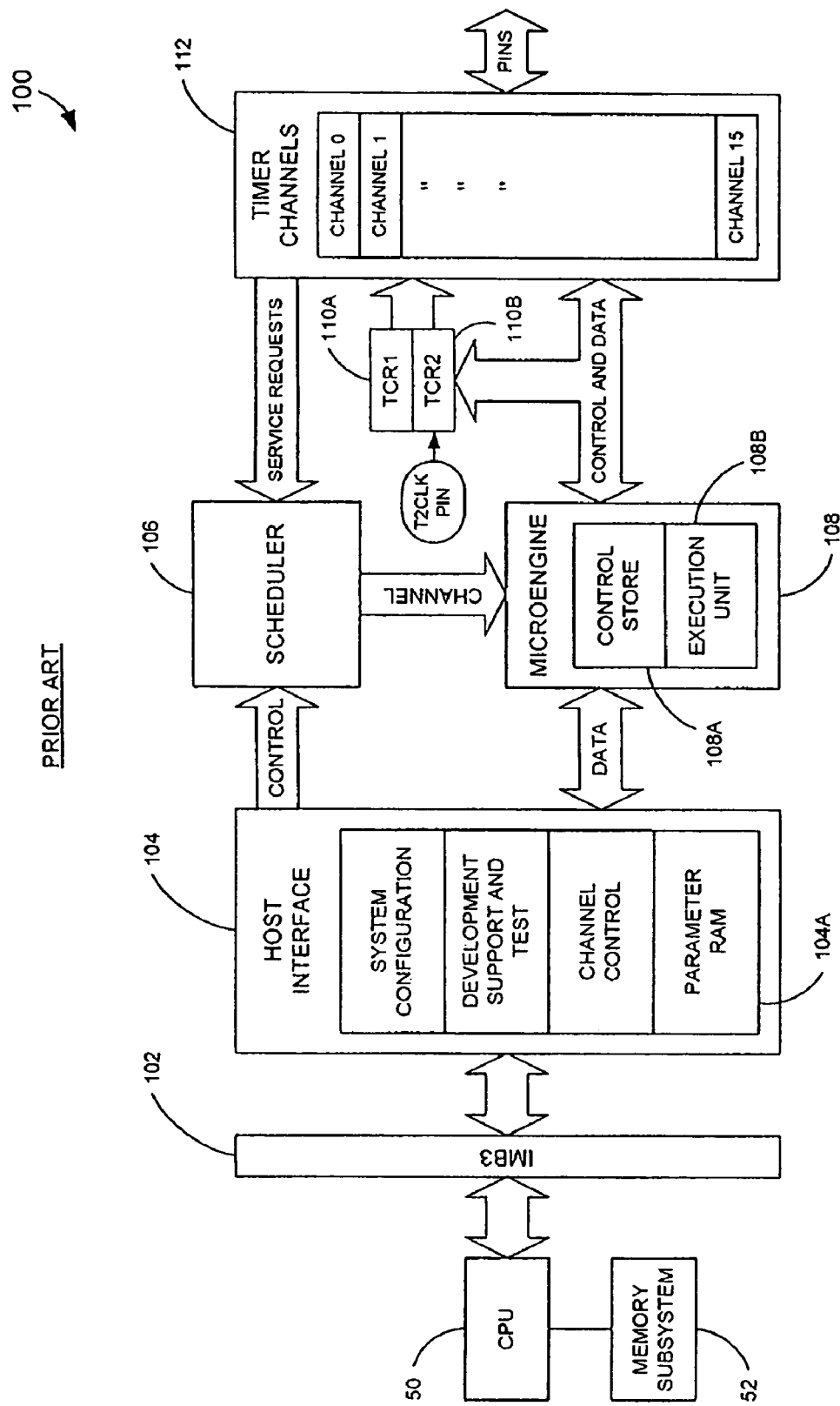
FIG. 1 is an exemplary block diagram of a microcontroller that includes an integrated time processing unit (TPU)

The present invention is directed to a technique for implementing an extended bit timer on a time processing unit (TPU), without using channel hardware of the TPU. According to the present invention, a timer is periodically read to determine the value of the timer. Next, the technique determines if the value of the timer is equal to or between a first count and a second count, e.g., 0000h and 7FFFh. The technique also determines if the value of the timer is equal to or greater than a third count. The technique increments a counter, e.g., created within a parameter RAM of the TPU, when rollover of the timer has occurred and de-asserts a coherency flag, e.g., created within a parameter RAM of the TPU, after the timer transitions through the first count. The technique asserts the coherency flag after the value of the timer transitions through the third count and combines the value of the timer with the value of the counter to provide a current count. The technique checks the coherency flag and the value of the timer and adjusts the current count when the coherency flag is asserted and the value of the timer is equal to or between the first and second counts. While the discussion herein is focused on a 16-bit TPU, the technique disclosed herein is broadly applicable to TPUs that have less than or more than sixteen bits.

According to one embodiment of the present invention, the CPU 50 is programmed to poll the TPU 100 at four times a rollover rate. For example, when the 16-bit timer rolls over every 64 mS, the CPU 50 polls the timer every 16 mS. When the CPU determines that the 16-bit timer crosses over 0000h, the CPU 50 increments an upper byte counter, e.g., created within the parameter RAM 104A, and de-asserts or clears a coherency flag, e.g., also created within the parameter RAM 104A. When the CPU 50 determines that the 16-bit timer crosses the 8000h point, i.e., a third count, the CPU 50 asserts or sets the coherency flag. The coherency flag and the upper byte counter may be implemented within the TPU 100 memory map of the parameter RAM 104A, located within the host interface 104. In this manner, the TPU 100 can read both parameters, i.e., the coherency flag and the upper byte counter, simultaneously. It should be appreciated that in order for the CPU 50 to accurately maintain the extended range timer, it is desirable that the parameters be coherent.

According to the present invention, TPUs that include 16-bit timers can have their range extended to, for example, perform 24-bit timer functions. To create a 24-bit timer, the TPU 100 reads one of its 16-bit timers, i.e., TCR1 or TCR2, and, if the value is between 8000h and FFFFh (inclusive), the TPU 100 can simply read the upper byte counter from memory and combine it with the 16-bit hardware timer value to form a 24-bit current timer count. If the value of the 16-bit timer is between 0000h and 7FFFh (inclusive), then it is unclear as to whether the upper byte counter in memory has been incremented by the CPU 50. Thus, if a coherency flag is asserted, e.g., high, the TPU 100 is required to add one to the value of the upper byte counter before combining it with the 16-bit hardware timer to form a 24-bit current timer count.

On the other hand, if the coherency flag is unasserted, e.g., low, then the CPU 50 has already incremented the upper byte counter and the TPU 100 simply uses the value stored in the parameter RAM for the upper byte counter when forming the 24-bit current timer count. This allows for a TPU code design that is substantially less complex and provides better throughput, smaller code size and simpler design and, thus, creates less risk of anomalous operation.

Thus, in many applications, a less complex TPU and, in turn, a less expensive TPU can be utilized for applications that previously have required multiple TPUs.

Figure 2:
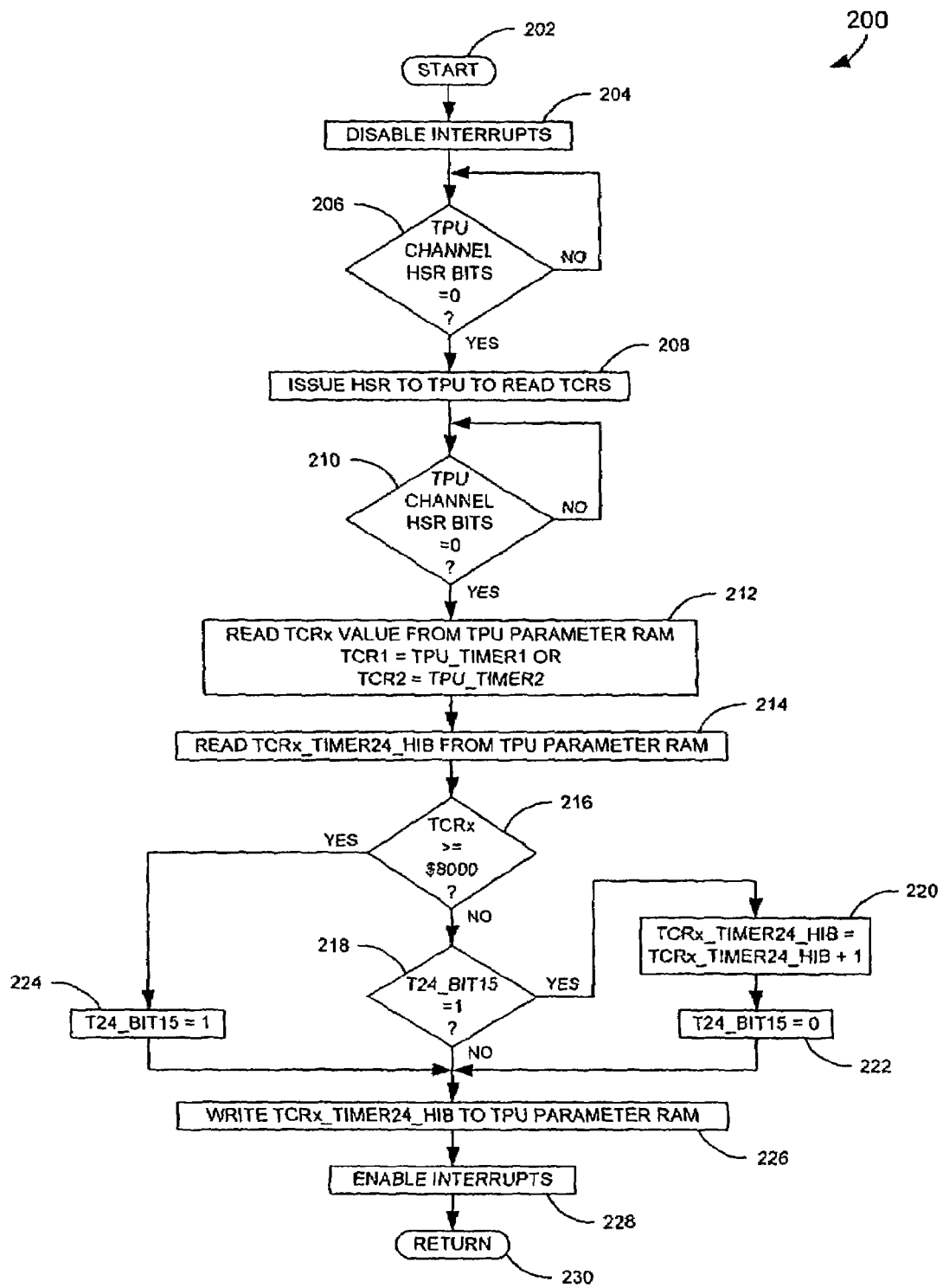
FIG. 2 is an exemplary flow chart of a routine for implementing a 24-bit timer.
Figure 3:
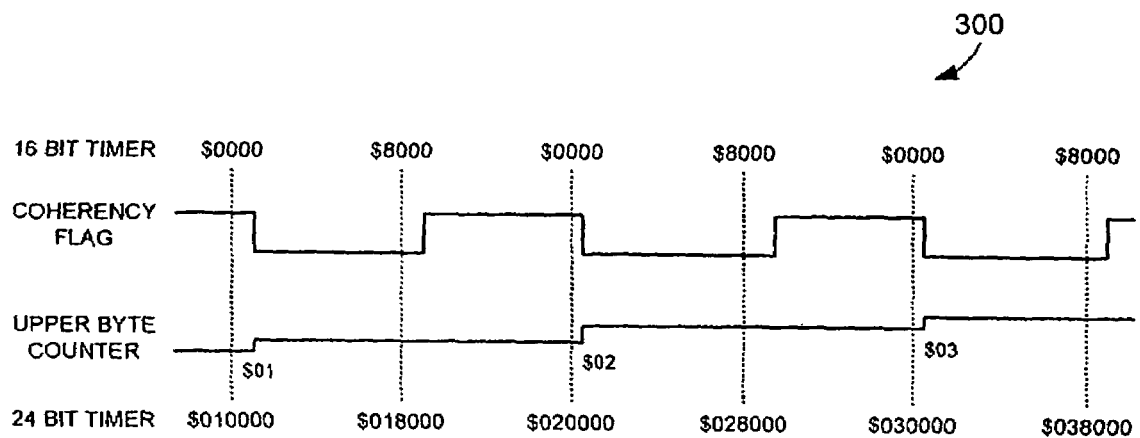
FIG. 3 is an exemplary timing diagram illustrating the implementation of a 24-bit timer according to an embodiment of the present invention.
Figure 4:
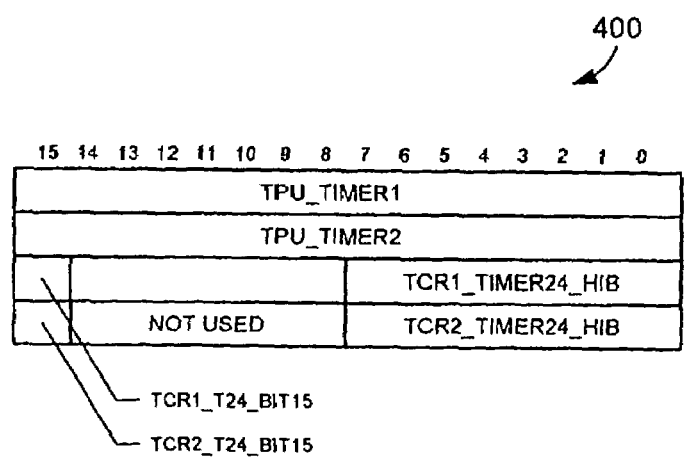
FIG. 4 is a parameter RAM memory map to implement a 24-bit timer.

With reference to FIGS. 2 and 3, a flow chart of an exemplary 24-bit service timer routine 200 and an associated timing diagram 300, respectively, are depicted. FIG. 4 depicts a memory for a 24-bit timer that is created within the parameter RAM 104A. It should be appreciated that either the TPU 100 or the CPU 50 may maintain the extended bit counters and coherency flags stored within the parameter RAM 104A. In the discussion below, the CPU 50 maintains the extended bit timers and the coherency flags. In step 202, the routine 200 is initiated, at which point control transfers to step 204, where the CPU 50 disables interrupts.

Next, in decision step 206, the CPU 50 determines whether the TPU channel host service request (HSR) bits are equal to zero. If so, control transfers to step 208. Otherwise, control loops on step 206. In step 208, the CPU 50 issues an HSR to the TPU 100 to cause the TPU 100 to read the timer registers TCR1 and TCR2. Then, in decision step 210, the CPU 50 determines whether the TPU channel HSR bits are equal to zero. If so, control transfers to step 212. Otherwise, control loops on step 210. In step 212, the CPU 50 reads the 16-bit value of the appropriate register TCR1 or TCR2 from the TPU parameter RAM 104A. Next, in step 214, the CPU 50 reads the upper byte counter, i.e., TCRx_Timer24_HIB from the TPU parameter RAM. Then, in step 216, the CPU 50 determines whether the 16-bit value of the timer stored in the parameter RAM is greater than or equal to 8000h. If so, control transfers from step 216 to step 224, where the CPU 50 sets the coherency flag T24_Bit15 equal to one, before transferring control to step 226.

In step 216, when the 16-bit value of the timer stored in the parameter RAM is less than 8000h, control transfers to decision step 218. In step 218, the CPU 50 determines whether the coherency bit T24_Bit15 is equal to one. If so, control transfers to step 220, where the upper byte counter is incremented, before clearing the coherency flag T24_Bit15 in step 222, at which point control transfers to step 226. In step 226, the CPU 50 writes the upper byte counter, i.e., TCRx_Timer24_HIB to the TPU parameter RAM, at which point control transfers to step 228, where the CPU 50 re-enables interrupts before terminating the routine 200. When an event occurs and the TPU 100 later needs to determine the extended range timer value, the TPU 100 reads the proper memory locations in the parameter RAM 104A and, if the coherency flag is asserted and the value of the timer is between 0000h and 7FFFh (inclusive), then the TPU 100 adds one to the value of the upper byte counter before combining it with the 16-bit hardware timer to form a 24-bit current timer count. When the coherency flag is de-asserted, the TPU 100 simply uses the value of the upper byte counter and combines it with the value of the 16-bit hardware timer to form the 24-bit current timer count.

Figure 5:
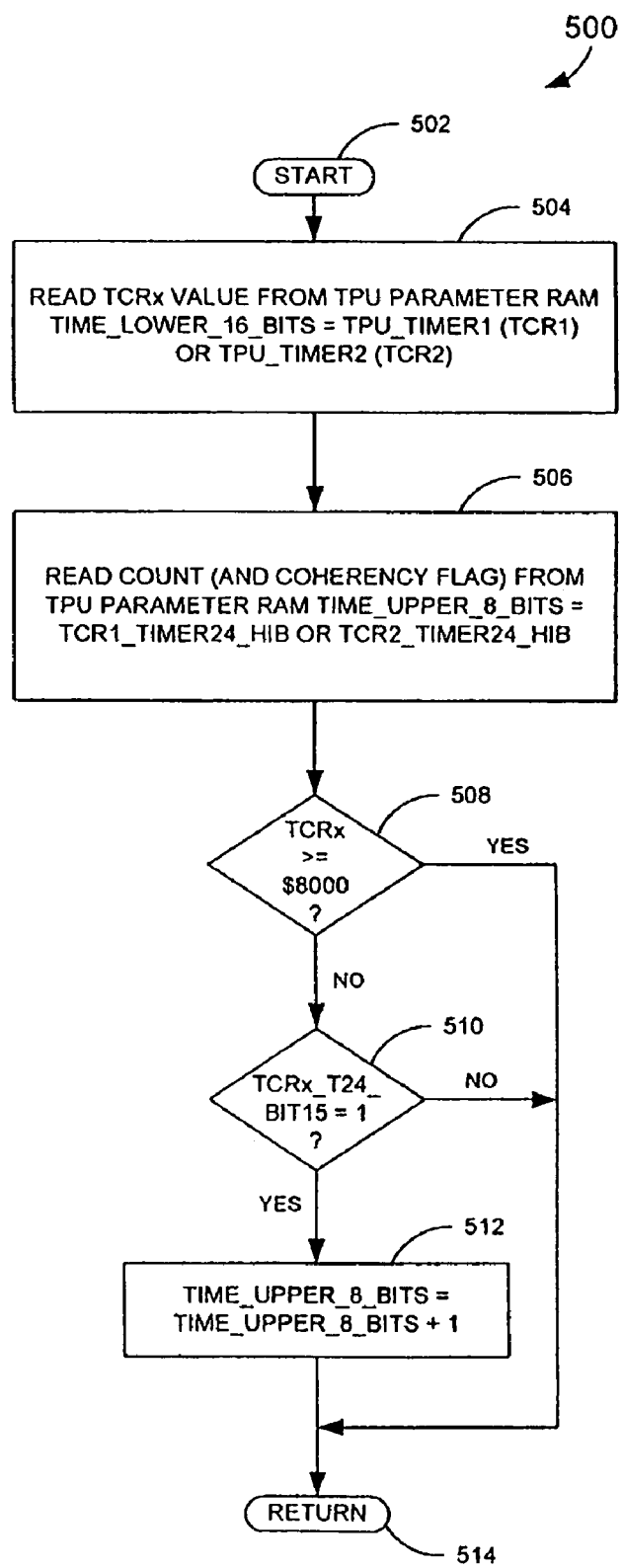
FIG. 5 is an exemplary flow chart of a current count adjust routine for implementing a 24-bit timer.

With reference to FIG. 5, a count adjust routine 500 is depicted in which the TPU 100 reads a 24-bit current timer count value and adjusts the read counter value when appropriate. In step 502, the routine 500 is initiated. Next, in step 504, the TPU 100 reads the 16-bit value of the appropriate register TCR1 or TCR2 from the TPU parameter RAM 104A. Then, in step 506, the TPU 100 reads the upper byte counter, i.e., TCRx_Timer24_HIB from the TPU parameter RAM and the coherency flag. Next, in decision step 508, the TPU 100 determines whether the 16-bit value of the timer stored in the parameter RAM is greater than or equal to 8000h. If so, control transfers to step 514, where the routine 500 returns to the calling routine. If the 16-bit value of the timer stored in the parameter RAM is not greater than or equal to 8000h, control transfers from step 508 to step 510, where the TPU 100 determines whether the coherency flag TCRx_T24_Bit15 is equal to one. If the coherency flag is not equal to one, control transfers from step 510 to step 514. If the coherency flag is equal to one, control transfers from step 510 to step 512, where the TPU 100 increments the read upper byte count Time_Upper_8_Bits by one before combining it with the 16-bit value of the timer to determine the 24-bit current timer count. Control then transfers from step 512 to step 514, where the routine returns to the calling routine.

Accordingly, a technique for extending a range of a TPU timer has been disclosed herein. Extending the range of a TPU timer, according to the present invention, is advantageous, as it allows channel hardware of the TPU to be more effectively utilized.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

What is claimed is:

1. A method for implementing an extended bit timer with a timer processing unit (TPU) without using channel hardware of the TPU, comprising the steps of:
   periodically reading a timer to determine a value of the timer;
   determining if the value of the timer is equal to or between a first count and a second count;
   determining if the value of the timer is equal to or greater than a third count;
   incrementing a counter after rollover of the timer has occurred;
   de-asserting a coherency flag after the timer transitions through the first count;
   asserting the coherency flag after the value of the timer transitions through the third count;
   combining the value of the timer with the value of the counter to provide a current count; and
   checking the coherency flag and the value of the timer and adjusting the current count when the coherency flag is asserted and the value of the timer is equal to or between the first and second counts.

2. The method of claim 1, wherein the timer is a sixteen-bit counter.

3. The method of claim 1, wherein the counter is an eight-bit counter.

4. The method of claim 1, wherein the timer is a sixteen-bit counter and the counter is an eight-bit counter.

5. The method of claim 1, wherein the timer is read at four times a rollover rate of the timer.

6. A system, comprising:
   a central processing unit (CPU);
   a time processing unit (TPU) including a plurality of channels;
   a dual-ported memory coupled to the CPU and the TPU; and
   code for instructing the CPU to perform the steps of:
     periodically reading a timer of the TPU to determine a value of the timer;
     determining if the value of the timer is equal to or between a first count and a second count;

determining if the value of the timer is equal to or greater than a third count;

incrementing a counter created within the dual-ported memory after rollover of the timer has occurred;

de-asserting a coherency flag created within the dual-ported memory after the timer transitions through the first count;

asserting the coherency flag after the value of the timer transitions through the third count;

combining the value of the timer with the value of the counter to provide a current count; and checking the coherency flag and the value of the timer and adjusting the current count when the coherency flag is asserted and the value of the timer is equal to or between the first and second counts.

7. The system of claim 6, wherein the TPU functions as one of an applications specific integrated circuit (ASIC), a field-programmable gate array (FPGA), a universal asynchronous receiver transmitter (UART), a data encryptor, a stepper motor controller, a multiphase commutation motor controller, a Hall effect decoder, a quadrature decoder, a frequency-to-digital (F/D) converter, a digital-to-frequency (D/F) converter, an analog-to-digital (A/D) converter and a digital-to-analog (D/A) converter.

8. The system of claim 6, wherein the timer is a 16-bit counter.

9. The system of claim 6, wherein the counter is an 8-bit counter.

10. The system of claim 6, wherein the timer is a 16-bit counter and the counter is an 8-bit counter.

11. The system of claim 6, wherein the timer is read at four times a rollover rate of the timer.

12. The system of claim 6, wherein the timer and the counter together provide 24-bit counter.

13. A system, comprising:
a central processing unit (CPU);
a time processing unit (TPU) including a plurality of channels;
a dual-ported memory coupled to the CPU and the TPU; and
code for instructing the TPU to perform the steps of:

periodically reading a timer of the TPU to determine a value of the timer;

determining if the value of the timer is equal to or between a first count and a second count;

determining if the value of the timer is equal to or greater than a third count;

incrementing a counter created within the dual-ported memory after rollover of the timer has occurred;

de-asserting a coherency flag created within the dual-ported memory after the timer transitions through the first count;

asserting the coherency flag after the value of the timer transitions through the third count;

combining the value of the timer with the value of the counter to provide a current count; and checking the coherency flag and the value of the timer and adjusting the current count when the coherency flag is asserted and the value of the timer is equal to or between the first and second counts.

14. The system of claim 13, wherein the TPU functions as one of an applications specific integrated circuit (ASIC), a field-programmable gate array (FPGA), a universal asynchronous receiver transmitter (UART), a data encryptor, a stepper motor controller, a multiphase commutation motor controller, a Hall effect decoder, a quadrature decoder, a frequency-to-digital (F/D) converter, a digital-to-frequency (D/F) converter, an analog-to-digital (A/D) converter and a digital-to-analog (D/A) converter.

15. The system of claim 13, wherein the timer is a 16-bit counter.

16. The system of claim 13, wherein the counter is an 8-bit counter.

17. The system of claim 13, wherein the timer is a 16-bit counter and the counter is an 8-bit counter.

18. The system of claim 13, wherein the timer is read at four times a rollover rate of the timer.

19. The system of claim 13, wherein the timer and the counter together provide 24-bit counter.

* * * * *